United States Patent
Luning et al.

(12) 
(10) Patent No.: US 6,329,257 B1
(45) Date of Patent: Dec. 11, 2001

(54) METHOD FOR LATERALLY PEAKED SOURCE DOPING PROFILES FOR BETTER ERASE CONTROL IN FLASH MEMORY DEVICES

(75) Inventors: Scott D. Luning, San Francisco; Daniel Sobek, Portola Valley; Timothy J. Thurgate, Sunnyvale, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/994,140

(22) Filed: Dec. 19, 1997

(51) Int. Cl.⁷ .................................................. H01L 21/336
(52) U.S. Cl. ............................ 438/301; 438/302; 438/376
(58) Field of Search ..................................... 438/302, 289, 438/301, 376, 262, 263, 265, 525, 201, 211, 257

(56) References Cited

U.S. PATENT DOCUMENTS

| | | | |
|---|---|---|---|
| 5,231,041 | * 7/1993 | Arima et al. | 437/43 |
| 5,460,991 | * 10/1995 | Hong | 437/43 |
| 5,482,881 | * 1/1996 | Chen et al. | 437/43 |
| 5,633,185 | * 5/1997 | Yiu et al. | 438/258 |
| 5,773,337 | * 6/1998 | Lee | 438/199 |
| 5,795,808 | * 8/1998 | Park | 438/301 |
| 5,930,629 | * 7/1999 | Fukumoto | 438/261 |

OTHER PUBLICATIONS

M.A. Omar, Elementary Solid State Physics: Principle and Applications, Addison–Wesley Publishing Company, p. 267, 1975.*

* cited by examiner

Primary Examiner—Olik Chaudhuri
Assistant Examiner—Hoai Pham
(74) Attorney, Agent, or Firm—Sawyer Law Group LLP

(57) ABSTRACT

A system and method for controlling a characteristic of at least one memory cell on a semiconductor is disclosed. The at least one memory cell includes a gate stack, a source, and a drain. The semiconductor includes a surface. In one aspect, the method and system include providing the gate stack on the semiconductor and providing the source including a source dopant having a local peak in concentration. The local peak in concentration of the source dopant is located under the gate stack and in proximity to a portion of the surface of the semiconductor. In another aspect the method and system includes a memory cell on a semiconductor. The semiconductor includes a surface. The memory cell includes a gate stack on the semiconductor, a source, and a drain. The gate stack has a first edge and a second edge. The source is located in proximity to the first edge of the gate stack. The drain is located in proximity to the second edge of the gate stack. A first portion of the source is disposed under the gate stack. The source includes a source dopant having a local peak in concentration of the source dopant. The local peak in concentration of the source dopant is located under the gate stack and in proximity to a portion of the surface of the semiconductor.

8 Claims, 5 Drawing Sheets

METHOD FOR LATERALLY PEAKED SOURCE DOPING PROFILES FOR BETTER ERASE CONTROL IN FLASH MEMORY DEVICES

FIELD OF THE INVENTION

The present invention relates to flash memory technology and more particularly to a method and system for controlling the doping profile of a source in a flash memory cell.

BACKGROUND OF THE INVENTION

A conventional flash memory cell includes a gate stack, a source, a drain, and a channel disposed between the source and the drain. To form a conventional memory cell, a tunnel oxide is grown or deposited on a semiconductor substrate. Typically, the gate stack is formed on the tunnel oxide and reoxidized. Reoxidation exposes the gate stack to an oxidizing agent at a high temperature, growing a layer of oxide on the gate stack. The reoxidation of the gate stack of the conventional memory cell improves erase characteristics.

After the growth of the oxide layer is completed in reoxidation, the source and drain are implanted and annealed. Annealing electrically activates and diffuses the source and drain implants.

A conventional memory cell formed using the above-described process includes a bird's beak shaped tunnel oxide and a source dopant which decreases in concentration closer to the center of the gate stack. The "bird's beak" shaped tunnel oxide is thicker near the edge of the gate stack than closer to the center of the gate stack. Note that the edge is actually a three dimensional face of the gate stack. Consequently, as used herein, edge is a three dimensional face. Only closer to the center of the floating gate does the oxide have a relatively constant thickness. The concentration of source dopant is highest at the surface of the semiconductor adjacent to the gate stack in part as a result of the annealing step. Consequently, the concentration of source dopant decreases toward the center of the gate stack.

Although the conventional memory cell functions, erase of the conventional memory cell may not be well controlled. To erase a conventional memory cell, tunneling of charge carriers between the floating gate and the source is used. Tunneling of charge carriers between the floating gate and the source depends on the thickness of tunnel oxide through which the charge carriers tunnel and on the doping profile of the source. Both the thickness of the tunnel oxide and the concentration of the source dopant vary under the gate stack. The appropriate combination of tunnel oxide thickness and source doping profile may be difficult to control. Tunneling of charge carriers between the floating gate and the source is, therefore, difficult to control. As a result, the erase characteristics of conventional memory cells may vary between cells on the same semiconductor.

Accordingly, what is needed is a system and method for better controlling erase characteristics. The present invention addresses such a need.

SUMMARY OF THE INVENTION

The present invention provides a method and system for controlling a characteristic of at least one memory cell on a semiconductor having a surface. The at least one memory cell includes a gate stack, a source, and a drain. In one aspect, the method and system comprise providing the gate stack on the semiconductor and providing the source including a source dopant having a local peak in concentration of the source dopant. The local peak in concentration of the source dopant is located under the gate stack and in proximity to a portion of the surface of the semiconductor. In another aspect the method and system comprise a memory cell on a semiconductor having a surface. The memory cell includes a gate stack on the semiconductor, a source, and a drain. The gate stack has a first edge and a second edge. The source is located in proximity to the first edge of the gate stack. The drain is located in proximity to the second edge of the gate stack. A first portion of the source is disposed under the gate stack. The source includes a source dopant having a local peak in concentration of the source dopant. The local peak in concentration of the source dopant is located under the gate stack and in proximity to a portion of the surface of the semiconductor.

According to the system and method disclosed herein, the present invention allows the erase characteristics of the memory cell to be better controlled, thereby increasing overall system performance.

DETAILED DESCRIPTION OF THE INVENTION

The present invention relates to an improvement in flash memory technology. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
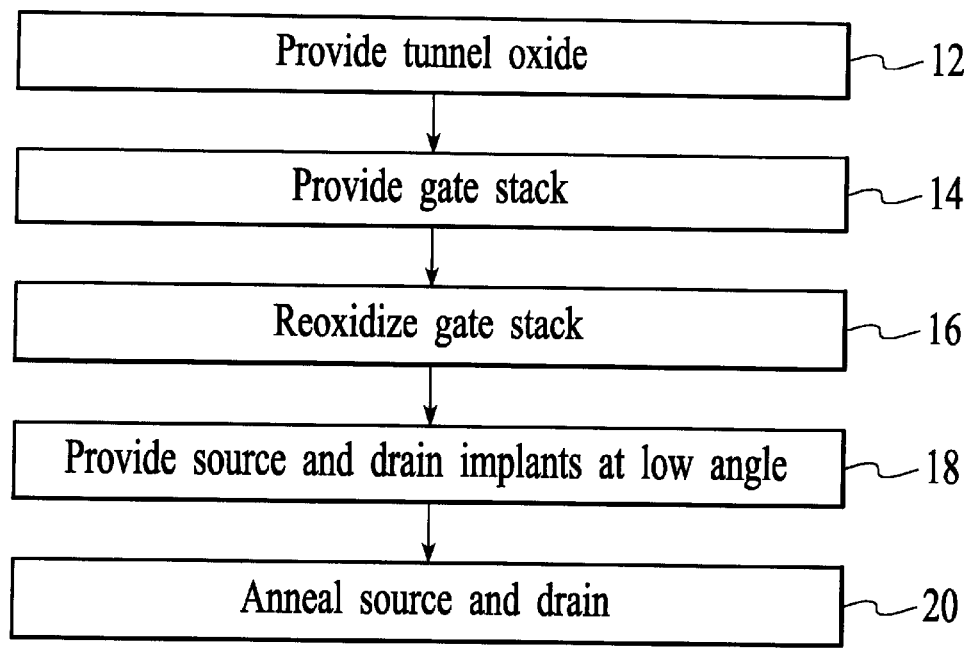
FIG. 1 is a flow chart of a conventional method for providing a flash memory cell.

FIG. 1 is a flow chart of a conventional method 10 for providing a flash memory cell. Only certain steps in the process are depicted in the method 10 of FIG. 1. A tunnel oxide is grown on a semiconductor substrate via step 12. A gate stack is then provided via step 14. Formation of a gate stack typically includes depositing layers of polysilicon separated by an oxide/nitride/oxide film and etching these layers to provide gate stacks. Typically, the gate stack includes a floating gate and a control gate which are each composed of polysilicon. The gate stack is then oxidized via step 16. This step is known as reoxidation. Source and drain implants are then provided via step 18. Typically, the source and drain implants are provided at a low angle, nearly perpendicular to the surface of the semiconductor. Usually this angle is within seven degrees of perpendicular to the surface of the semiconductor on which the memory cell is formed. The source and drain implants are annealed via step 20. Note that steps 18 and 20 may be provided separately for source and drain implants. Moreover, different anneals may be provided for the different implants. The source implant is typically includes a phosphorus implant and an arsenic implant.

Growth of an oxide layer during reoxidation step 16 enhances erase characteristics of the conventional memory cell. For example, the reoxidation step 16 rounds the corners of the floating gate by oxidizing the polysilicon floating gate. The corners are rounded to reduce electric fields concentrated at the corners of the floating gate during erase and improve reliability of the conventional memory cell. However, the reoxidation step 16 also results in the tunnel oxide being thicker near the edges of the gate stack than near the center of the gate stack. The thickness of the tunnel oxide may be relatively constant only near the center of the gate stack where the tunnel oxide is thinner.

The annealing step 20 also serves several purposes. Annealing the source and drain implants electrically activates the implant and allows the implant to diffuse. Thus, the implants are driven further into the semiconductor and under the gate stack. Driving the source implant farther under the gate stack improves erase characteristics because the tunnel oxide is thinner near the center of the gate stack. The effect of annealing can be seen in FIGS. 2, 3A and 3B.

Figure 2:
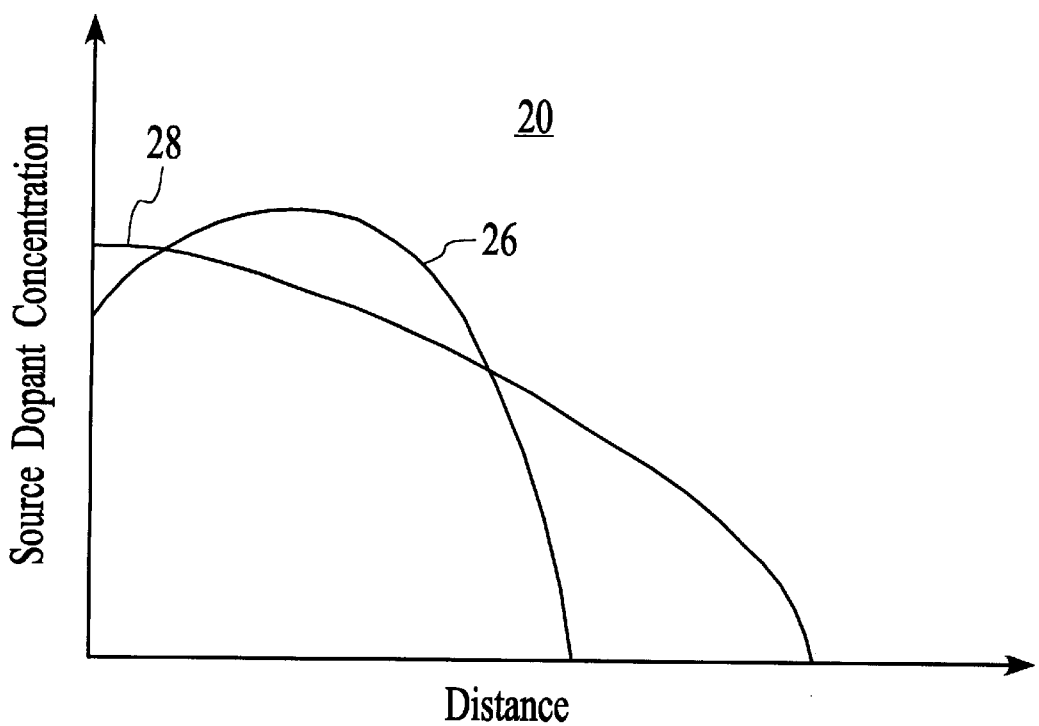
FIG. 2 is a graphical depiction of the concentration of source dopant versus the distance along a vertical line under a surface of a semiconductor in a conventional memory cell.

FIG. 2 is a graphical illustration 25 of the doping profile for a source before and after annealing. The doping profile 26 represents the concentration of dopant versus the distance perpendicular to the surface of the semiconductor prior to annealing. A maximum in the doping profile 26 is a particular distance under the surface semiconductor that depends in part on the energy of the implant. The dopant concentration falls off rapidly after the maximum in the doping profile 26.

The doping profile 28 represents the concentration of dopant versus the distance perpendicular to the surface of the semiconductor after annealing. Annealing has caused the dopant to diffuse, spreading the doping profile 26 to form the doping profile 28. Because the dopant cannot diffuse beyond the surface of the semiconductor, there is a maximum in dopant concentration at or near the surface of the semiconductor next to the edge of the floating gate. Thus, the maximum in concentration of the dopant has moved from within the semiconductor to near the surface of the semiconductor.

Figure 3A:
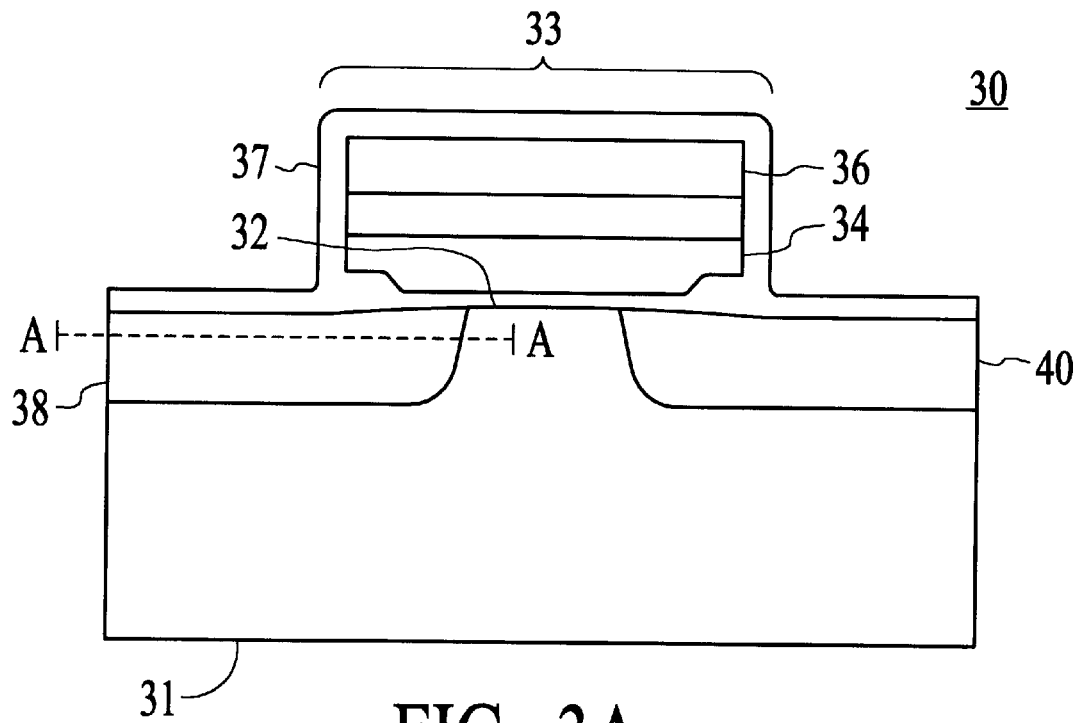
FIG. 3A is a schematic of a conventional memory cell after annealing of the source and drain implants.

FIG. 3A depicts a conventional memory cell 30 on semiconductor 31 after annealing. The conventional memory cell 30 includes tunnel oxide 32, gate stack 33 and oxide layer 37 grown during reoxidation. In one embodiment, the gate stack 33 includes a floating gate 34 and a control gate 36. The conventional memory cell 30 also includes a source 38 and drain 40. Because of the annealing, the source 38 has diffused farther under the gate stack 33 where the tunnel oxide 32 is thinner. Note that although the memory cell 30 is depicted in two dimensions, the memory cell is three dimensional. Thus, an edge of the gate stack 33 or floating gate 34 is a three dimensional face. Consequently, in the context of this application, an edge is a face of a structure in three dimensions.

Figure 3B:
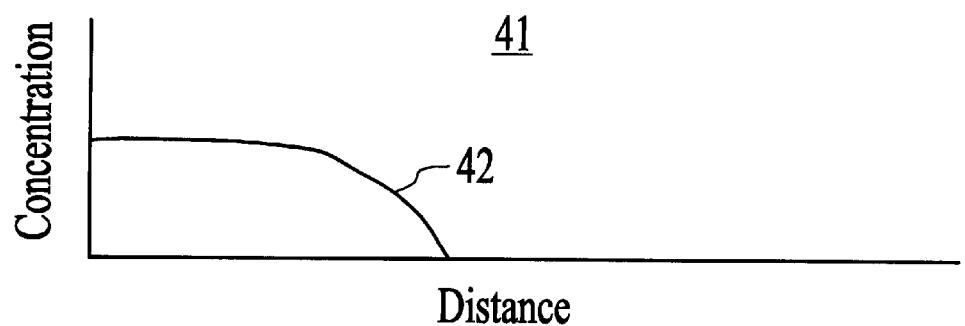
FIG. 3B is a graphical representation of the concentration of source dopant versus the distance along a line A—A in the source region of a conventional memory cell.

FIG. 3B depicts the concentration of source dopant versus the distance in the source region laterally along the line A—A in FIG. 3A, parallel to the surface of the semiconductor some small distance into the surface of the semiconductor. Referring to FIG. 3B, the curve 42 represents one aspect of the source dopant profile. The concentration of source dopant decreases from the edge of the gate stack 33 towards the center of the gate stack 33 due to the spread of the doping profile 28.

Although the conventional memory cell 30 formed in accordance with the method 10 functions, those with ordinary skill in the art will realize that the erase characteristics of the conventional memory cell 30 are not well controlled. To erase the conventional memory cell 30, tunneling of charge carriers between the floating gate 34 and the source 38 is used. During erase, a high negative bias is placed on the floating gate 34, while a high positive bias is placed on the source 38. As a result, charge carriers tunnel between the floating gate 34 and the source 38.

Tunneling of charge carriers between the floating gate 34 and the source 38 depends on the thickness of tunnel oxide 32 through which the charge carriers tunnel and the doping profile 28 of the source after annealing. Tunneling increases exponentially with a decrease in thickness of the tunnel oxide 32. For a source having a uniform concentration, tunneling will increase exponentially closer to the center of the gate stack 33. Tunneling also increases with an increase in the concentration of source dopant. For a tunneling oxide 32 of uniform thickness, tunneling will increase closer to the edge of the gate stack 33 because of the doping profile 28. Thus, the tunnel oxide thickness and doping profile are competing factors in tunneling. Controlling the combination of tunnel oxide thickness and source doping profile may be difficult. Therefore, the tunneling of charge carriers between the floating gate and the source is difficult to control. As a result, the erase characteristics of conventional memory cell 30 may vary between cells on the same semiconductor.

The present invention provides for a method and system for controlling the erase characteristics of a memory cell on a semiconductor. In one aspect, the method and system comprise providing a gate stack on the semiconductor and providing a source including a source dopant having a local peak in concentration of the source dopant located under the gate stack and in proximity to a surface of the semiconductor. In another aspect the method and system comprise a memory cell on a semiconductor. The memory cell includes a gate stack on the semiconductor, a source, and a drain. The gate stack has a first edge and a second edge. The source is located in proximity to the first edge of the gate stack. The drain is located in proximity to the second edge of the gate stack. A first portion of the source is disposed under the gate stack. The source includes a source dopant having a local peak in concentration of the source dopant located under the gate stack and in proximity to a surface of the semiconductor.

The present invention will be described in terms of providing a single cell using particular dopants. However, one of ordinary skill in the art will readily recognize that this method and system will operate effectively for other methods including other steps and other dopants and methods which provide multiple cells in a single process, as well as memories having multiple memory cells.

Figure 4A:
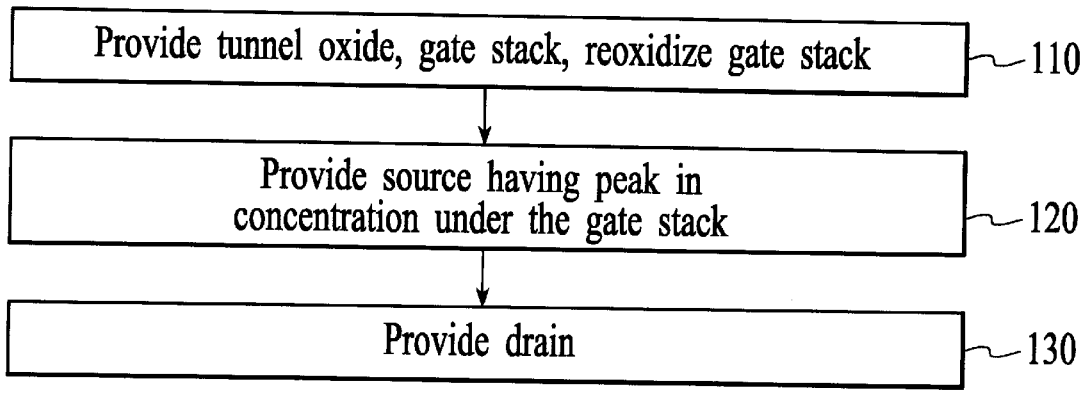
FIG. 4A is a flow chart depicting a method for providing a memory cell in accordance with the present invention.

To more particularly illustrate the method and system in accordance with the present invention, refer now to FIG. 4A depicting a flow chart a method 100 for forming a flash memory cell in accordance with the method and system. A tunnel oxide and gate stack are formed via step 110. The gate stack is also reoxidized via step 110. The formation of the tunnel oxide and the formation and reoxidation of the gate stack may be carried out using conventional processes. A source having a local peak in the doping profile under the gate stack and in proximity to the surface of the semiconductor is then provided via step 120. As used herein, a local peak is a peak in concentration of source dopant in the region under the gate and in proximity to the surface of the semiconductor on which the tunnel oxide resides. Note that nothing prevents the source from having a global maximum in concentration in another region, including a region not under the gate stack. A drain is also provided via step 130.

Figure 4B:
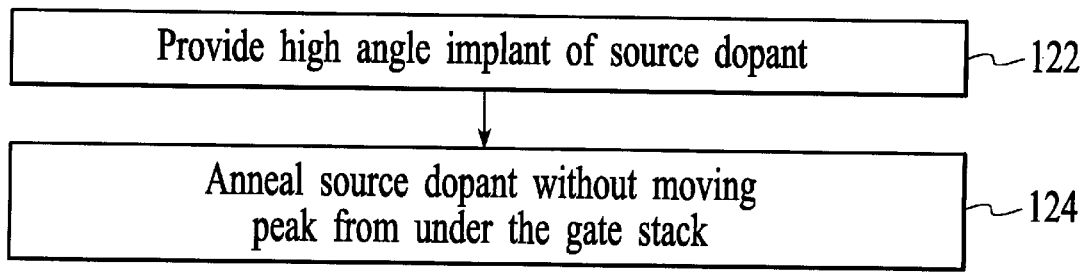
FIG. 4B is a flow chart depicting a method for providing a source having a doping profile in accordance with the present invention.

FIG. 4B depicts one embodiment of the step 120 of providing a source having a local peak in the doping profile under the gate stack and in proximity to a surface of the semiconductor. A high angle implant is provided for the source via step 122. The high angle is an angle that is significantly tilted with respect to the perpendicular to the surface of the semiconductor. As a result of the high angle, the local peak in concentration of the dopant for the high angle implant is under the gate stack. In one embodiment, the high angle is between approximately thirty and forty five degrees from perpendicular to the surface of the semiconductor.

The source may be annealed via step 124. The annealing step 124 electrically activates the source dopant and may allow the source dopant to diffuse. However, the annealing should be sufficiently short so that the local peak in concentration of the dopant remains under the gate stack. In a preferred embodiment, the dopant used in the high angle implant step 122 is a slowly diffusing dopant, allowing for longer anneals at higher temperatures in annealing step 124. In one embodiment, this dopant is an n type dopant such as antimony. In another embodiment, this dopant is a p type dopant such as indium.

Figure 4C:
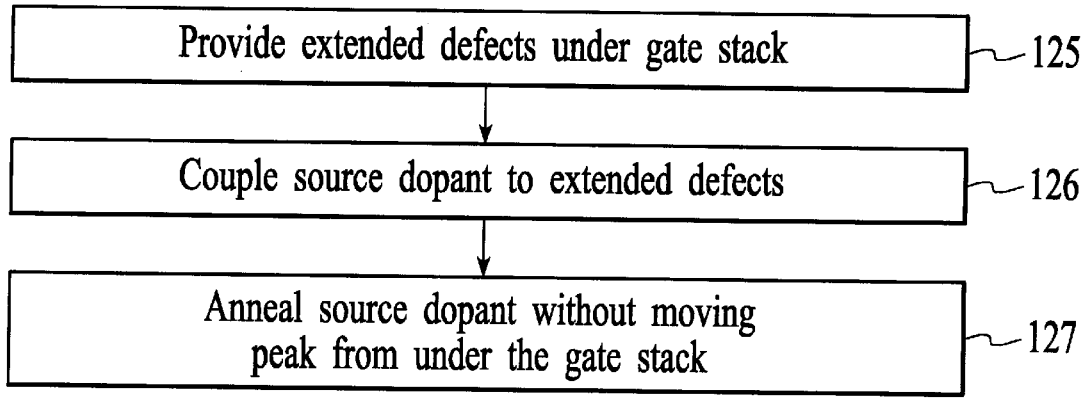
FIG. 4C is a flow chart depicting another method for providing a source having a doping profile in accordance with the present invention.

FIG. 4C depicts a second embodiment of the step 120 of providing a source having a local peak in the doping profile under the gate stack and in proximity to a surface of the semiconductor. First, extended defects are created under the gate stack via step 125. Extended defects tend not to diffuse significantly during annealing. The source dopant is then coupled to these extended defects via step 126. The source is then annealed. Because the source dopant is coupled to defects which do not move significantly during annealing or because the source dopant migrates to the location of the defects, the dopant does not move significantly during annealing. Thus, the local peak in the concentration of source dopant remains under the gate stack.

Figure 5:
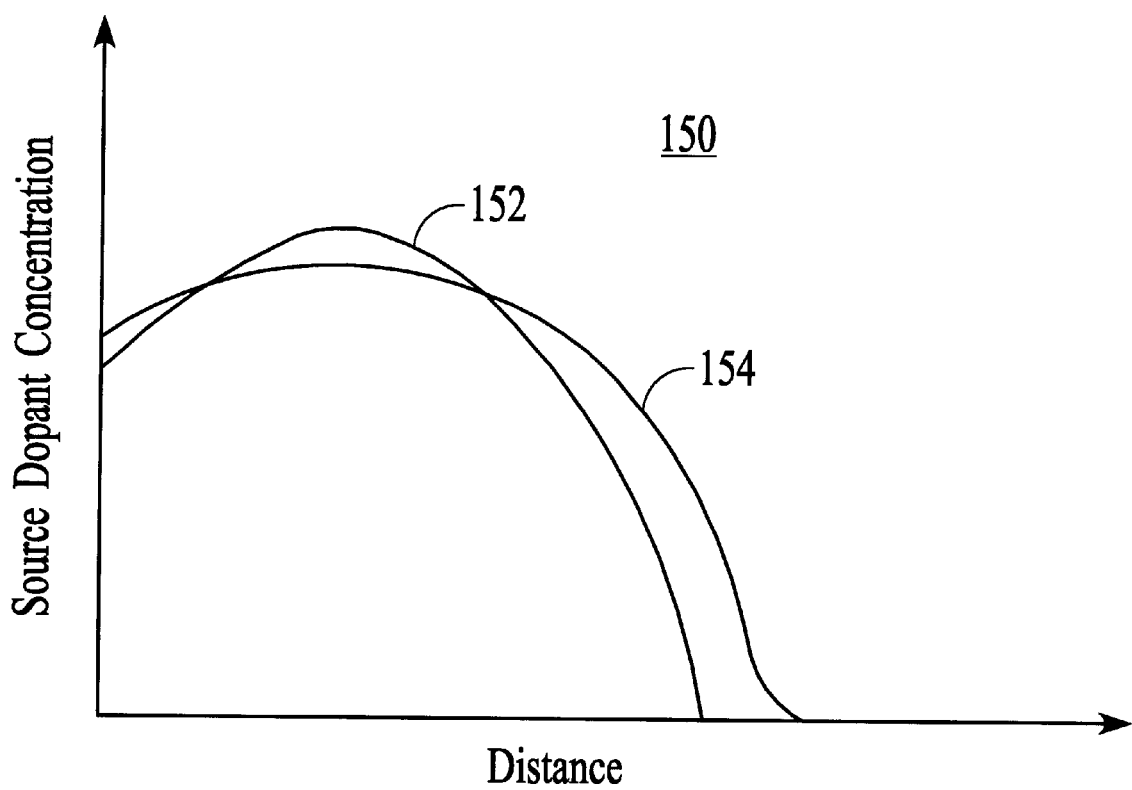
FIG. 5 is a graphical depiction of the concentration of source dopant versus the distance along a vertical line under a surface of a semiconductor in a memory cell in accordance with the present invention.

FIG. 5 is a graphical illustration 150 of the doping profiles for a source formed in accordance with the method 120 before and after annealing. The doping profile 152 represents the concentration of dopant versus the distance perpendicular to the semiconductor surface prior to annealing. The maximum of the doping profile 152 is a particular distance under the surface semiconductor that depends in part on the energy of the implant. Because the implant was performed at a high angle, a local peak, not shown, lies under the gate stack and close to the surface of the semiconductor. The dopant concentration falls off rapidly after the maximum in the doping profile 152.

The doping profile 154 represents the concentration of dopant versus the distance perpendicular to the semiconductor after annealing. Annealing has caused the dopant to diffuse slightly. As a result, the doping profile 152 has spread slightly to form the doping profile 154. Because annealing was reduced and/or because the dopant tends to diffuse less, the maximum in the doping profile has not moved to the surface of the semiconductor 201 away from the floating gate 204. Because the dopant was implanted at a high angle, the local peak, not shown, will remain beneath the floating gate 204.

Figure 6A:
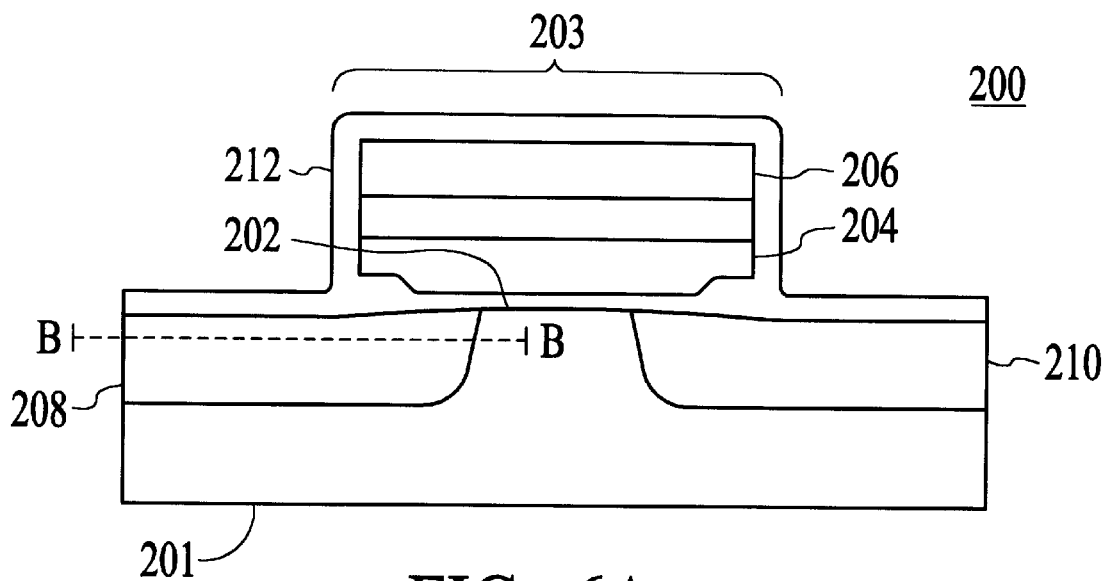
FIG. 6A is a schematic of a memory cell in accordance with the present invention after annealing of the source and drain implants.
Figure 6B:
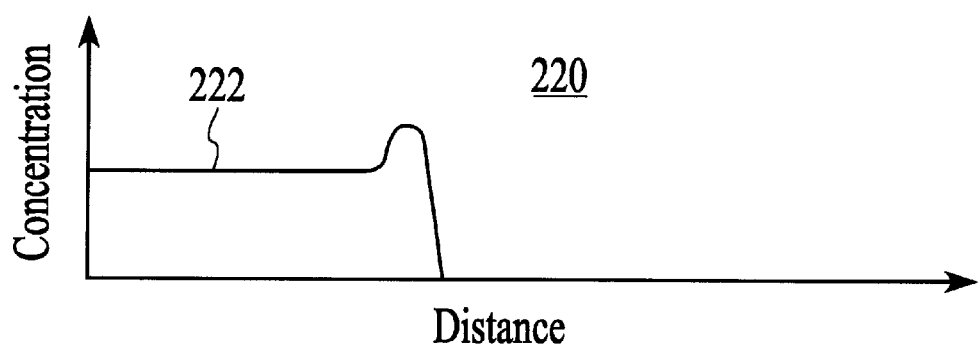
FIG. 6B is a graphical representation of the concentration of source dopant versus the distance along a line B—B in the source region of a memory cell in accordance with the present invention.

FIG. 6A depicts a flash memory cell 200 in accordance with the present on semiconductor 201 after annealing. The memory cell 200 includes tunnel oxide 202, gate stack 203 and oxide layer 212 grown during reoxidation. In one embodiment, the gate stack 203 includes a floating gate 204 and a control gate 206. The conventional memory cell 200 also includes a source 208 and drain 210. Because the source 208 was formed using a high angle implant, the source 208 extends under the floating gate 204. Because of the annealing, the source 208 has diffused slightly farther under the gate stack 203. FIG. 6B is a graphical representation of the concentration of source dopant versus the lateral distance in the source region under the gate stock along the line B—B of FIG. 6A, parallel to the surface of the semiconductor a short distance into the surface of the semiconductor. FIG. 6B has the same horizontal scale as FIG. 6A. The curve 222 depicts the source concentration. Referring to both FIG. 6A and FIG. 6B, the local peak in concentration of the source dopant is located where the thickness of the tunnel oxide 202 is relatively constant. Moreover, in a preferred embodiment, the local peak in concentration of the source dopant is located where the tunnel oxide 202 is also relatively thin, towards the center of the gate stack 203. This can be seen in a comparison of FIGS. 6A and 6B, which have the same horizontal scale. The local peak in the curve 222 occurs where the tunnel oxide 202 is both thin and of relatively constant thickness.

Because the local peak in concentration of the source dopant can be placed where the thickness of the tunnel oxide 202 is relatively constant, tunneling will depend primarily on the concentration of the source dopant. Tunneling is more easily controlled by varying a parameter, source dopant concentration. Therefore, erase characteristics can be more easily controlled. In addition, manufacturing may be made more consistent, meaning that there will be less variation between flash memory cells. Moreover, because this local peak can be placed where the tunnel oxide 202 is relatively thin, tunneling is increased and erase efficiency improved.

A method and system has been disclosed for controlling tunneling by controlling the doping profile of the source. As a result, erase characteristics can be controlled. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for controlling a characteristic of at least one memory cell on a semiconductor, the semiconductor having a surface, the at least one memory cell including a gate stack, a source, and a drain, the method comprising the steps of:

(a) providing the gate stack on the semiconductor; and (b) providing the source in a single implant step, the source including a source dopant having a local peak in concentration of the source dopant, the local peak in concentration being located under the gate stack and in proximity to a portion of the surface of the semiconductor.

2. The method of claim 1 wherein the source dopant is indium.

3. The method of claim 1 wherein the source dopant is antimony.

4. The method of claim 1 further comprising the step of:

(c) providing a tunnel barrier having a thickness, a first portion of the tunnel barrier being disposed between the source and the gate stack;
wherein the local peak in concentration of the source dopant is located under a second portion of the tunnel barrier where the thickness is approximately constant.

5. The method of claim 4 wherein the local peak in concentration of the source dopant is further located under a third portion of the tunnel barrier where the thickness is minimized.

6. The method of claim 1 wherein the gate stack providing step (a) further includes the steps of:

(a1) providing a floating gate; and (a2) providing a control gate disposed above the floating gate.

7. The method of claim 6 further comprising the steps of:

(d) providing a drain.

8. The method of claim 7 wherein the characteristic controlled is an erase characteristic.

* * * * *